(12) United States Patent
Fryer et al.

(10) Patent No.: US 8,617,784 B2
(45) Date of Patent: Dec. 31, 2013

(54) INCREASING PHOTORESIST PROCESSING THROUGHPUT

(75) Inventors: David Fryer, Hillsboro, OR (US); Vivek Singh, Portland, OR (US); Nikolay Suetin, Moscow (RU); Alex A. Granovsky, Moscow (RU)

(73) Assignee: Intel Corporation, Santa Clara, CA (US)

( * ) Notice: Subject to any disclaimer, the term of this patent is extended or adjusted under 35 U.S.C. 154(b) by 1749 days.

(21) Appl. No.: 11/441,767

(22) Filed: May 26, 2006

(65) Prior Publication Data

US 2007/0275323 A1    Nov. 29, 2007

(51) Int. Cl.
*G03F 7/38*     (2006.01)
*G03F 7/039*    (2006.01)

(52) U.S. Cl.
CPC . *G03F 7/38* (2013.01); *G03F 7/039* (2013.01)
USPC ......... 430/170; 430/270.1; 430/326; 430/330

(58) Field of Classification Search
USPC ............................ 430/270.1, 326, 330, 170
See application file for complete search history.

(56) References Cited

U.S. PATENT DOCUMENTS

| 5,360,698 | A  | * | 11/1994 | Hanrahan     | 430/324   |
|-----------|----|---|---------|--------------|-----------|
| 6,048,669 | A  | * | 4/2000  | Yamatsu et al. | 430/321 |
| 6,280,902 | B1 | * | 8/2001  | Yako et al.  | 430/270.1 |
| 6,656,660 | B1 | * | 12/2003 | Urano et al. | 430/270.1 |
| 6,838,224 | B2 | * | 1/2005  | Ohsawa et al.| 430/270.1 |

* cited by examiner

*Primary Examiner* — John Chu

(74) *Attorney, Agent, or Firm* — Trop, Pruner & Hu, P.C.

(57) ABSTRACT

Two acids may be formed per exposed photon using free radical promotion so that two acid products are produced via two parallel pathways. This results in increased fabrication facility throughput. In some embodiments, this may be achieved while reducing side-lobe defect liability.

10 Claims, 1 Drawing Sheet

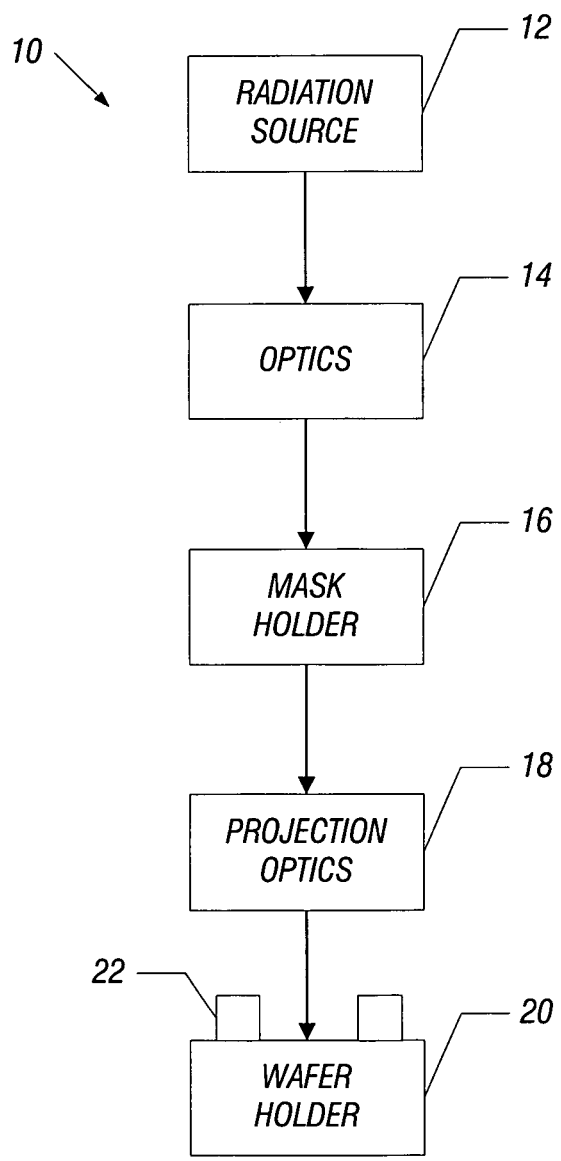

INCREASING PHOTORESIST PROCESSING THROUGHPUT

BACKGROUND

This relates generally to the manufacture of semiconductor wafers and, in particular, aspects to the patterning of such wafers.

Semiconductor wafers are processed to form integrated circuits in a highly efficient, repeatable fashion. One of the keys to semiconductor fabrication processes is the use of patterning. In a patterning process, a pattern on a mask is transferred repeatedly to wafers in a successive fashion. Generally, a lithographic system exposes a mask to radiation to transfer a pattern from the mask to a semiconductor wafer.

The wafer itself may have a photoresist which, when exposed to that radiation, changes its etch characteristics. Thus, regions exposed to radiation by the mask pattern have different etch characteristics than regions that were not exposed. Then, the photoresist may be etched to reveal the pattern in the photoresist. Thereafter, the patterned photoresist may be utilized as an etch mask to etch underlying layers.

Since there tend to be a large number of such patterning processes, the throughput of wafers through a semiconductor fabrication facility is affected by the amount of time that it takes to perform these patterning steps.

In one well known process, the degradation of the photoresist is achieved by using photoacid generators (PAGs). Thus, the efficiency of these PAGs may affect the throughput of the fabrication facility.

BRIEF DESCRIPTION OF THE DRAWINGS

FIG. 1 is a schematic depiction of an exposure tool according to one embodiment of the present invention.

DETAILED DESCRIPTION

In accordance with some embodiments of the present invention, the throughput of a semiconductor fabrication facility and, particularly, the resist patterning operation may be increased by increasing the number of acid molecules which are generated per photon of resist exposure. In other words, the more acid molecules that are generated upon exposure to photons, the more quickly the photoresist is degraded. In some embodiments of the present invention, the acid generation may be twice as high as in conventional processes.

In one embodiment, the increased acid generation is achieved using a photoacid generator of the bis-sulphonyl-substituted diazomethane type such as di-(phenylsulphonyl) diazomethane (DPSD). Conventionally, DPSD is activated by Wolff rearrangement at approximately 18 Kcal/mol, producing a single acid product. In some embodiments of the present invention, free radical promotion can be encouraged which involves 6 Kcal/mol, resulting in two acid products via two separate pathways. In some embodiments, the way that the free radical promotion is encouraged is to use exposure to elevated temperatures to reduce the activation energy barrier to form additional photoacid generators from the secondary process of free radical generation. For example, temperatures of five to ten degrees above conventional temperatures may be utilized in some embodiments.

Resist sensitivity is a critical process property of a photoresist material. It may strongly influence the manufactureability of a process based on given resist formulations. The overall throughput of the product is affected by the time necessary to process wafers through scanners in the fabrication facility since dozens of exposure fields must be completed on each die on a wafer. The sensitivity and throughput may both be increased by as much as two times in some embodiments. Since the quantum yield is a function of free radical diffusion distance, the probability of side-lobe generation from background dose is also reduced in lightly exposed regions, in some embodiments.

Thus, increasing the probability of free radical generation during exposure, producing secondary products, leads to the formation of additional photoacid molecules. At the same time, the dose to size side-lobe defects increases based on free radical diffusion distance, whereas this value is fixed across all dose values for conventional photoacid generator design.

The photoacid generators, when added to photoresists, may increase by as much as two times the manufacturing throughput of the material, while reducing side-lobe defect liability.

The DPSD may be exposed to photons and heated to form $PhSO_2CSO_2Ph$ (where Ph stands for phenyl), which is a singlet carbene plus nitrogen gas. The $PhSO_2CSO_2Ph$ may be converted to $PhSO_2COSOPh$, which is oxathiirene oxide. The activation energy is less than 6 Kcal/mol.

Then, the $PhSO_2CSOPh$ is converted to $PhSO_2$ plus PhSO plus carbon monoxide. The compound $PhSO_2$, plus PhSO, plus carbon monoxide is a second major product of photo-induced decomposition of DPSD. Minor geometrical distortions lead to exothermic decomposition of diazo-based photoacid generators, resulting in formation of PhSO and $PhSO_2$ radicals, as well as a carbon monoxide molecule. Particularly, $PhSO_2$ and poly-(4-hydroxystyrene) (PHOST) are converted to a radical chain leading to an acid, while PHSO and PHOST are converted to a radical chain leading to an acid in a parallel path. This conversion may involve a fast recombination with zero activation energy, leading to the formation of $PhSOSO_2Ph$ molecules.

A feature of the DPSD radical compound derivative is that, unlike compound products of the singlet carbene or oxophirene oxide, its calculated maximum absorbance lines lies in the 685 to 736 $cm^{-1}$ range with strong absorbance at 530, 659, 1093, and 1359 $cm^{-1}$, as well.

The $PhSO_2$ plus PhSO then combines to form $PhSO_2SOPh$. That can then be combined with PHOST to form two acids and other products.

The DPSD may be exposed to photons at a higher than typical temperature, from about 10 to about 15° C. higher than room temperature, within the exposure tools, such as a scanner, with as much as a two times increase in quantum yield. The pathway of decomposition of DPSD is even more preferable in polymer matrixes at higher temperatures.

The process design may reduce sensitivity to background dose from scattering or flare in a scanner lens since the distance at which the photoacid generator forms relative to neighboring photoacid generator exceeds the distance for free radical diffusion.

The DPSD compound will produce two acids when exposed to photons at elevated temperatures in the presence of hydroxy-styrene units in the polymer backbone. The current state of the art involves a sequential process of exposure at room temperature, then bake. By combining the exposure and baking steps, more than one acid per photon may result for this photoacid generator/polymer combination.

The exact recipe will vary based on the activation energy of the de-protection reaction. Higher temperature is desired up to the point where de-protection chemistry occurs. The de-protection reaction should only occur after exposure, during conventional bake step. To avoid premature resist reactions, the temperature is typically 25 degrees C. below the glass transition temperature of the polymer matrix. The decomposition of the photoacid generator is nearly instantaneous, as long as the resist temperature is constant across the exposure field, there is no need to change the exposure rate.

The elevated temperature exposure process will work with combinations of diazo-methane based photoacid generators in material which includes hydroxy-styrene sub-units in the resist polymer.

Other conventional components, such as protecting groups, may be included as part of the photoresist. Tertiary butyl carbonyl may be used as a protecting group in the photoresist in one embodiment. Adhesive promoters and soluble bases may also be used in some embodiments.

FIG. 1 shows a patterning system. The system includes a radiation source 12, an optics 14, an illumination system 18, a mask holder 16, and a wafer holder 20.

Radiation source 12 generates electromagnetic radiation. Radiation can be adapted for use in lithographic patterning of microelectronic devices to expose photosensitive materials. Radiation can be fully or partially coherent in that the emitted optical waves maintain a fixed and predictable phase relationship with each other for a period of time. Radiation has a characteristic wavelength in various portions of the system, including in the vicinity of substrate on the wafer holder 20.

Optics 14 can include an aperture, a condenser, as well as additional devices for collecting, shaping, collimating, directing, filtering, and focusing radiation emitted from source 12.

A mask is positioned in the system by a mask holder 16 to influence the incidence of radiation upon substrate. A mask can include different regions that transmit electromagnetic radiation with different transmissivities and/or phases. The transmission of electromagnetic radiation by the mask can be engineered to image a pattern of desired features on substrate. For example, the mask can be a binary mask or it can be a phase shifting mask (such as an alternating phase shifting mask or an embedded phase shifting mask). The mask can transmit radiation (as shown) or the mask can reflect radiation.

Illumination system 18 can include an aperture, an objective, as well as additional devices for collecting, filtering, and focusing the portion of radiation that passes through the mask onto the substrate. For example, illumination system 18 can include a filtering projection lens and/or reduction optics.

A substrate is a workpiece to be patterned by the system 10. The substrate includes a working surface that includes the photoresist. The substrate can be presented to the system by a vacuum chuck or other support such that radiation is focused in the vicinity of the working surface to image desired features in photosensitive material.

The wafer holder 20 may include a heater 22 to heat the wafer during exposure. In one embodiment, the heater 22 may be a ring-shaped resistance heater. Other heaters may also be used. The heater 22 may heat portions of the wafer not exposed to radiation.

There are two independent, competing paths or channels to acid product for DPSD in PHOST during exposure—the primary, highest probability channel is controlled either by the temperature or by the initial non-equilibrium vibrational population of photo-excited DPSD and photo-generated carbene molecules. The particular case found in experiment depends on the ratio of the rate of vibrational relaxation of the carbene molecule and the carbene isomerization/decomposition rate. At high temperatures, the vibrational relaxation processes are faster than the rates of chemical transformations, and the reaction rates are controlled thermally.

The cross-over between the two photo-decomposition processes with temperature can be described based on rate constant for reaction. The rate constant of unimolecular carbene isomerization/decomposition can be estimated as: $k=\bar{\omega}\cdot\exp(-E_a/RT)$, where $\bar{\omega}$ is the frequency of the normal mode vibration leading to isomerization/decomposition and $E_a$ is the activation barrier. Thus, for first channel: $k_1=\bar{\omega}\cdot\exp(-E_{a1}/RT)$, and for the second channel: $k_2=\bar{\omega}_2\cdot\exp(-E_{a2}/RT)$. As these two channels are independent and the process of interest is unimolecular and is described by the first-order kinetic equations, the total rate of decomposition is simply $k=k_1+k_2$, and the relative amount of carbene decomposed via second channel is:

$$\varphi = \frac{k_2}{k_1 + k_2}.$$

By substituting expressions for $k_1$ & $k_2$, one gets:

$$\varphi = \frac{\bar{\omega}_2 \cdot \exp(-E_{a2}/RT)}{\bar{\omega}_1 \cdot \exp(-E_{a1}/RT) + \bar{\omega}_2 \cdot \exp(-E_{a2}/RT)}. \quad (1)$$

In the case of DPSD, $\bar{\omega}_1=1300$ cm$^{-1}$, $\bar{\omega}_2=970$ cm$^{-1}$, $E_{a1}=5.5$ kcal/mole, $E_{a2}=6.0$ kcal/mole. Note that $\phi$ is a monotonically increasing function of temperature, however, a third competing process, the de-protection reaction at elevated temperatures, will reduce formation of acid product.

To determine the optimum process temperature for exposure, the rate of acidolysis for protecting group chemistry is calculated (via catalysis only, thermal de-protection will typically be at elevated temperature and not impact this process temperature calculation).

The ratio of kinetic rate constant with $\phi$ results in following form:

$$\varphi_2 = \frac{k_2}{k_1 + k_2 + k_3},$$

where $k_3$ has standard Arhennius form for first-order kinetics. For typical measured values for activation energy (53 kJ/mol) and pre-exponential (ln($A_0$)=15.87) in conventional 193 nm resist materials heating from about 10 to about 15 degrees over the room temperature is advantageous. In general, temperature may be set to where the derivative of $\phi_2$ is about zero.

In some embodiments the photoresist is heated while exposing the photoresist to radiation in an exposure tool. The photoresist may be heated to a temperature determined by the ratio of relative amount of carbene decomposed via a second channel to the sum of carbene decomposed by a first and the second channel without exceeding a temperature for a deprotection reaction.

A method may comprise forming more than one acid in a photoresist per absorbed photon. The method may include heating the photoresist while exposing it to radiation. The method may also include heating while exposing the photoresist to a temperature less than about 25° C. below the glass transition temperature of the photoresist.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming more than one acid in a photoresist per absorbed photon; and
   heating the photoresist to a temperature less than about 25° C. below the glass transition temperature of the photoresist while exposing it to radiation.

2. The method of claim 1 including using a photoresist with a photoacid generator of the bis-sulphonyl-substituted diazomethane type.

3. The method of claim 2 including heating to a temperature determined by the ratio of relative amount of carbene decomposed via a second channel to the sum of the carbene decomposed by a first and the second channel without exceeding a temperature for a de-protection reaction.

4. The method of claim 1 including using a photoresist including hydroxystyrene.

5. The method of claim 1 including generating two acids per absorbed photon.

6. A method comprising:
   heating a photoresist while exposing the photoresist to radiation in an exposure tool;
   forming more than one acid per absorbed photon; and
   heating to a temperature less than about 25° C. below the glass transition temperature of the photoresist.

7. The method of claim 6 including using a photoresist including hydroxystyrene.

8. The method of claim 6 including using a photoresist with a photoacid generator of the bis-sulphonyl-substituted diazomethane type.

9. The method of claim 6 including heating portions of the wafer not exposed to said radiation.

10. The method of claim 8 including heating to a temperature determined by the ratio of relative amount of carbene decomposed via a second channel to the sum of the carbene decomposed by a first and the second channel without exceeding a temperature for a de-protection reaction.

* * * * *